United States Patent [19]
Furnival

[11] Patent Number: 6,147,869
[45] Date of Patent: Nov. 14, 2000

[54] ADAPTABLE PLANAR MODULE

[75] Inventor: Courtney Furnival, Temecula, Calif.

[73] Assignee: International Rectifier Corp., El Segundo, Calif.

[21] Appl. No.: 09/197,078

[22] Filed: Nov. 20, 1998

Related U.S. Application Data

[60] Provisional application No. 60/066,452, Nov. 24, 1997.

[51] Int. Cl.$^7$ ................................................ H05K 7/20
[52] U.S. Cl. ........................ 361/719; 361/704; 361/707; 361/713; 361/752; 174/52.2; 174/52.3; 165/80.3; 165/185; 257/706; 257/717
[58] Field of Search .................................... 361/204, 707, 361/688, 715, 717–719, 723, 736, 752, 761, 796, 730; 174/52.2, 52.4, 52.3; 257/687, 706, 707, 713, 787, 796; 165/80.3, 185

[56] References Cited

U.S. PATENT DOCUMENTS

| | | | |
|---|---|---|---|
| 4,899,256 | 2/1990 | Sway-Tin | 361/715 |
| 4,965,710 | 10/1990 | Pelly et al. | 363/56 |
| 5,353,194 | 10/1994 | Libretti et al. | |
| 5,373,418 | 12/1994 | Hayasi | 361/707 |
| 5,398,160 | 3/1995 | Umeda | 361/707 |
| 5,408,128 | 4/1995 | Furnival | |
| 5,408,383 | 4/1995 | Nagasaka et al. | |
| 5,450,288 | 9/1995 | Tanuma et al. | |
| 5,521,437 | 5/1996 | Oshima et al. | 257/701 |
| 5,536,972 | 7/1996 | Kato | 257/706 |
| 5,576,934 | 11/1996 | Roethlingshoefer et al. | |
| 5,606,487 | 2/1997 | Yasukawa et al. | 361/707 |
| 5,616,888 | 4/1997 | McLaughlin et al. | |
| 5,625,536 | 4/1997 | Soyano et al. | 361/736 |
| 5,646,827 | 7/1997 | Hirao et al. | |
| 5,657,203 | 8/1997 | Hirao et al. | |
| 5,689,091 | 11/1997 | Hamzehdoost et al. | |
| 5,747,876 | 5/1998 | Majumdar et al. | 257/687 |
| 5,825,625 | 10/1998 | Esterberg et al. | 361/719 |

FOREIGN PATENT DOCUMENTS

| | | |
|---|---|---|
| 3272163 | 12/1991 | Japan. |
| 5304248 | 11/1993 | Japan. |
| 407 007 994 | 1/1995 | Japan. |
| 98223 | 1/1997 | Japan. |

*Primary Examiner*—Leo P. Picard
*Assistant Examiner*—Boris K. Chervinsky
*Attorney, Agent, or Firm*—Ostrolenk, Faber, Gerb & Soffen, LLP

[57] ABSTRACT

An Adaptable Planar Module (APM) provides a new packaging concept suitable for motor control and other functions. An insulated metal substrate (IMS) supports power semiconductor devices and is formed in an opening in a support base and extends at or below a bottom surface of a base to allow for thermal contact with a heatsink. A circuit board for supporting and interconnecting lower power devices is mounted above and spaced from the support base and has an opening therein which is located above the IMS. The circuit board has bonding pads which are electrically connected to the low power devices. Bonding wires provide an electrical connection between the bonding pad of the printed circuit board and the power devices on the IMS substrate. Integral or procured terminals are also provided for external connections. Additional circuit boards may also be provided in the module and arranged co-planar with or above the first circuit board. The circuit boards may be supported by raised wall portions that extend from the support base. High grade potting material may be provided atop the IMS substrate, and lower grade potting material filling the remainder of the module. A lid may also be provided atop the circuit board and IMS.

38 Claims, 13 Drawing Sheets

ADAPTABLE PLANAR MODULE

RELATED APPLICATION

This application claims the priority of provisional application Serial No. 60/066,452, filed Nov. 24, 1997.

BACKGROUND OF THE INVENTION

The present invention relates to a novel module housing for semiconductor devices and, more specifically, relates to a novel module structure employing an IMS (insulated metal substrate), one or more printed circuit boards, interconnects and other components in a novel housing structure.

Known semiconductor device modules are used for housing a plurality of interconnected semiconductor chips. The chips may be of the same or of diverse kind and may be mounted on a heatsink or other substrate within a common housing having terminal electrodes which extend from the housing.

In a power application, such as for a motor control circuit or similar functions, both high power devices, from which heat must be removed, as well as low power devices, which do not require heatsinking, are employed. Typically, the heatsinking may be provided by mounting the devices on an IMS which is enclosed in a module housing. Such substrates and modules are described in U.S. Pat. No. 5,408,128, issued Apr. 18, 1995 in the name of the inventor of the present application and assigned to International Rectifier Corporation, the present assignee. However, when both power and low power devices are required for an application, the inclusion of low power devices on an IMS greatly increases the cost of the module. Alternatively, the high power devices are included within the IMS module and the low power devices are mounted externally in other modules, thus greatly increasing the footprint of the circuit as well as requiring additional interconnections between the high and low power devices.

It is therefore desirable to provide a device package which houses both the high and low power devices and in which the package size is reduced, the number and lengths of interconnects are minimized, and in which heatsinking is provided only for the high power devices.

SUMMARY OF THE INVENTION

The present invention provides an "adaptable planar module" (APM), namely a new packaging concept for motor control and similar functions. The package is especially suited for low cost and small motor control systems, though the basic concept can be extended to larger, higher power systems.

The APM of the invention includes a minimum IMS substrate suitable for the power devices and other devices. The IMS substrate may support an input bridge, an inverter, and other components and sits beneath an open cavity of a printed circuit board ("PCB"). The PCB and the IMS substrate are potted in a molded shell that is provided with connectors. The PCB provides a low cost platform for the low power devices that do not require heatsinking and thus need not be situated on the IMS substrate. Interconnecting the IMS and the PCB are standard wire bonds that connect the semiconductor die on the IMS substrate and those on the PCB.

The invention thus eliminates redundant interconnects, provides cost savings and improves reliability. Specifically, the partitioning of the devices and the IMS size reduction save cost. The size reduction and direct bond to the die also reduce the unit IMS cost by eliminating the need for special plating and by allowing for a thinner IMS.

The APM of the present invention typically includes an IMS, a printed circuit board, a support base or shell, power terminals, and grounding terminals. Environmental considerations may also be taken into account. An external control PCB with keypad and I/O terminals, a cover, and a heatsink may also be included.

The IMS substrate of the APM may include an inverter, one or three phase inputs, a thermistor, a negative buss shunt and a ground fault shunt. Epoxy or solder die attachments may be used. The substrate may be suitable for any or all of 0.18, 0.37 or 0.75 kilowatt applications. The size of the substrate is, for example, 1.2 inches by 0.8 inches. Also, pollution 1 standard compliance with a coating may be provided, as may be 2500 V dielectric isolation.

The shell or package of the APM may include a molded shell that supports the IMS, the power PCB and the cover. The shell, for example, has a footprint of about 2.83 inches× 5.12 inches (72×130 mm) with extended terminals. Three or four, for example, M4 mounting screws may be used for earth, panel, internal and heatsink grounding, respectively. The package preferably has a low profile of 0.375 inches, as an example, and may be made of high temperature and high strength plastic.

The power PCB of the APM may typically be a single PCB that can include a drive circuit, protection circuits, SMPS, filters, buss capacitors, soft-charge, terminals and a control board interface connector. The PCB is generally, for example, about 5.2 inches×2.6 inches. Preferably, the PCB is formed of two layers, though four layers are also possible. The top side of the PCB may include an SMD and a through-hole. The bottom side of the PCB may include a SMD of, preferably, up to 1.3 inches. The PCB may also include pollution 1 spacing with both sides coated or potted.

The power terminals are typically LMI or Schneider type. As an example, a three output motor is used as well as a two or three input line. The PCB may be grounded to earth at the input end, and preferably meets UL 508C specifications at 600V. The power terminals may be soldered to the power PCB.

Preferably, the APM conforms to a pollution level 2 requirement, though level 3 conformity may be provided if select control pins are managed. The APM may also be protected from vibration, shock and other mechanical stresses.

The primary grounding of the APM is preferably the heatsink. A motor shield may be clamped to the heatsink for EMC specification compliant grounding and for motor grounding to the heatsink. An input side mounting screw may connect the line earth, panel and panel ground to the heatsink and to the internal ground. A jumper from the heatsink that internally grounds the EMC terminal may also be provided.

A control PCB may be included in the APM or may be provided externally and interface with a connector and ribbon cable. The control PCB may preferably include a microprocessor, "shrubbery", keypad and a Wago I/O connector. The control PCB typically mechanically snaps into the cover and is connected by flex cable.

A cover may interface with the APM shell and is preferably a molded cover with a product-dependent height. The cover may provide a mechanical and electrical connection to the components, and may include a snap-on coupling to the shell and may permit mounting screws through the shell to the heatsink. The cover may also provide support for the control board and vents for capacitor cooling. Optionally, the cover is UL 50 specification compliant.

An external heatsink serves as the mounting surface for the APM. Three sizes are preferable for the heatsink, all of which preferably have the same footprint, namely an extruded aluminum heatsink for 0.37 kilowatt applications, extruded aluminum for 0.75 kilowatt applications, or an aluminum plate for 0.18 kilowatt applications. The heatsink is preferably sized for providing final power dissipation without using a fan. Typically, three or four tapped holes may be provided to connect the heatsink to the APM. The heatsink may also be mountable to a back panel or to a DIN rail.

The innovative shell design may provide any or all of the following features: location and support of the IMS substrate, optimum contact to the heatsink mounting surface, support of the PCB including wire bond support, space for SMD components on the bottom surface of the PCB, space for both SMD and leaded components on the top side of the PCB. A small depressed cavity above the IMS is provided for the IMS components and is preferably filled with a hi-grade potting compound that contacts the IMS die. The remainder of the package, including the PCB and other components, can thus be covered with a lower cost potting compound.

The shell may also create an external terminal housing, when such a housing is more cost effective than using procured terminals. Alternatively, the shell can create a partitioned area to attach procured terminals to the PCB.

Other, larger components such as buss capacitors, filter capacitors, and inductors may require special mounting and interconnects. These components may be attached to the PCB and may be allowed to protrude from the potting compound, or they may be placed atop an additional PCB. The additional PCB may be a co-planar extension of the first PCB or may be situated on a second level, depending on the size, number and cost of the component mounting, and will differ from one product to another. It may be advantageous, in some packages, to attach the larger components, such as the buss capacitors, to the bottom of the package and include an appropriate cover.

The top surface of the package may also accommodate a control key board which leads to the PCB.

Other applications, such as for appliances, may not require terminals and may incorporate lower cost fast-on connectors. Applications such as industrial controllers may add extra functions as well as higher power and mechanical structures.

The adaptability of the Adaptable Planar Module allows for flexibility in the design of products by modifying the layout of either the PCB or the IMS without any significant change in hard tooling. Other changes can also be made by building the shell mold with a changeable insert for the IMS substrate cavity or by incorporating a multiple upper mold cavity to accommodate higher walls for double boards, special connectors, an optional keyboard, and the like.

Thus, the APM provides a low cost package that allows for fuller system integration in a single module. Specific system functions may include: an inverter, input bridge, current sensing, short circuit and overtemperature protection, driver circuits, input/output filters, PFC, brake, a control microprocessor, and a keyboard.

In accordance with the invention, a semiconductor device module includes a support base that has an opening which extends from its top surface to its bottom surface. A planar, thermally conductive substrate extends across the support base opening and has a bottom surface that is situated at or below the bottom surface of the support base for contacting an external heatsink. One or more semiconductor devices are mounted on a top surface of the thermally conductive substrate. At least one circuit board is arranged above and is spaced from the top surface of the support base and has an opening that is situated above the thermally conductive substrate, and one or more other semiconductor devices are mounted on a top surface of the circuit board. At least one bonding pad area is arranged at a periphery of the opening in the circuit board and is electrically connected to the semiconductor devices of the circuit board. One or more bonding wires connect the semiconductor devices of the thermally conductive substrate to the bonding pad.

Other aspects of the invention include a motor drive module and a micro-converter module.

Plural, interconnected semiconductor devices may be mounted on thermally conductive substrate. The thermally conductive substrate may be an IMS. A power die or an inverter circuit may be mounted on the thermally conductive substrate.

The support base may include raised portions which extend above the support base top surface and which surrounds the opening in the circuit board to form a cavity above the thermally conductive substrate. The cavity may be filled with a high grade potting material, and at least part of a region atop the surface board may be filled with a low grade potting material. Further raised portions in the support base may support the circuit board.

Integral terminals, mounted atop the circuit board, or procured terminals, formed in a raised portion of the support base, may provide electrical connections and are electrically connected with the devices of the circuit board. Another circuit board may be mounted above and spaced from the circuit board, or may be mounted co-planar with the circuit board, and has further devices mounted on its surface. A keyboard may be mounted atop one of the circuit boards, and additional devices may be mounted on the bottom surface.

Other features and advantages of the present invention will become apparent from the following description of the invention which refers to the accompanying drawings.

BRIEF DESCRIPTION OF THE DRAWINGS

The invention will now be described in greater detail in the following detailed description with the reference to the drawings in which.

DETAILED DESCRIPTION OF THE INVENTION

Figure 1C:
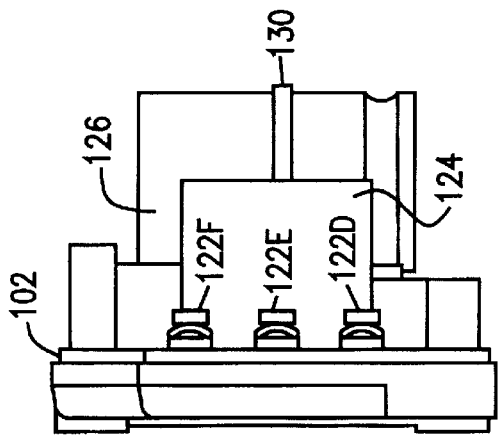
FIGS. 1A, 1B, 1C and 1D show top, side, front and rear end views, respectively, of an adaptable planar module according to an embodiment of the invention.
Figure 1D:
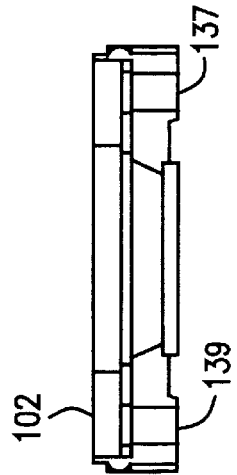

Referring first to FIG. 1, there is shown in FIGS. 1A–1D an APM 100 according to an embodiment of the invention.

The APM includes a support base 102 which supports a printed circuit board 110. Mounted atop printed circuit board 110 are various electrical components including choke 124, resistors 131, 132, capacitors 133, 134, 135, 136, 138, transformer 148, inductors 141 and 146 as well as additional circuit elements 140, 142 and 144 and other components, all of which are interconnected by printed wiring (not shown) on circuit board 110. Also provided are I/O pins 127 and 129 and terminals 122A–122F which provide external connections to the circuit board. A support tray 166 rests atop circuit board 110 and supports capacitors 126 and 128 which are electrically connected to circuit board 110 and which are held in place by belt 130. Openings 137 and 139 extend through support tray 131, circuit board 110 and support base 102 for securing the APM.

Figure 1A:
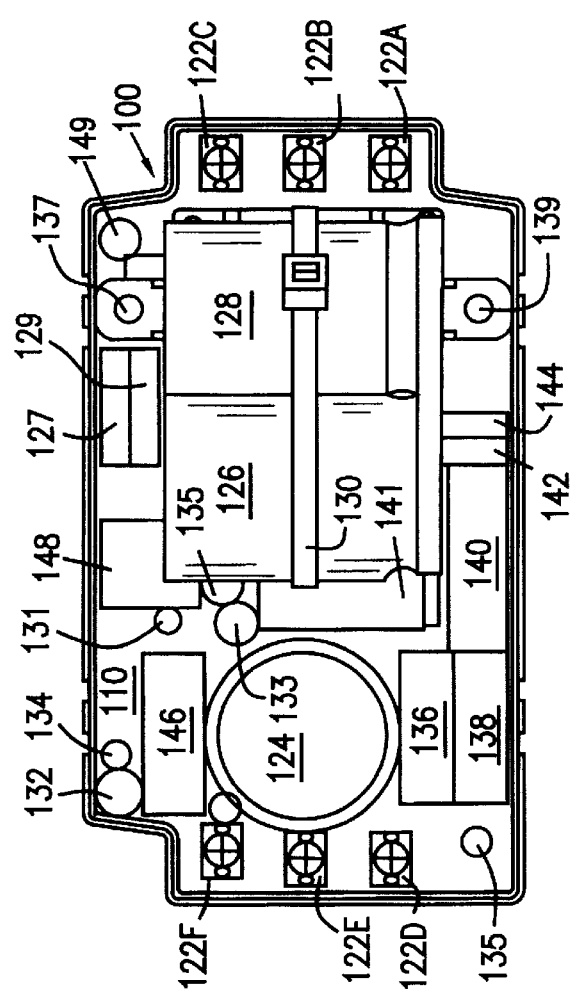
Figure 1B:
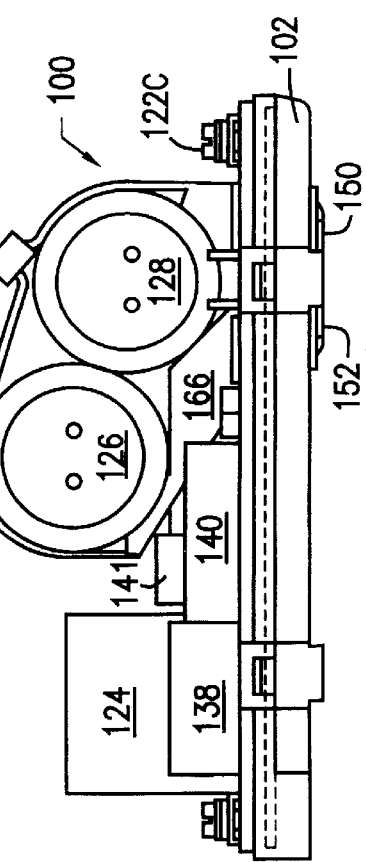
Figure 2:
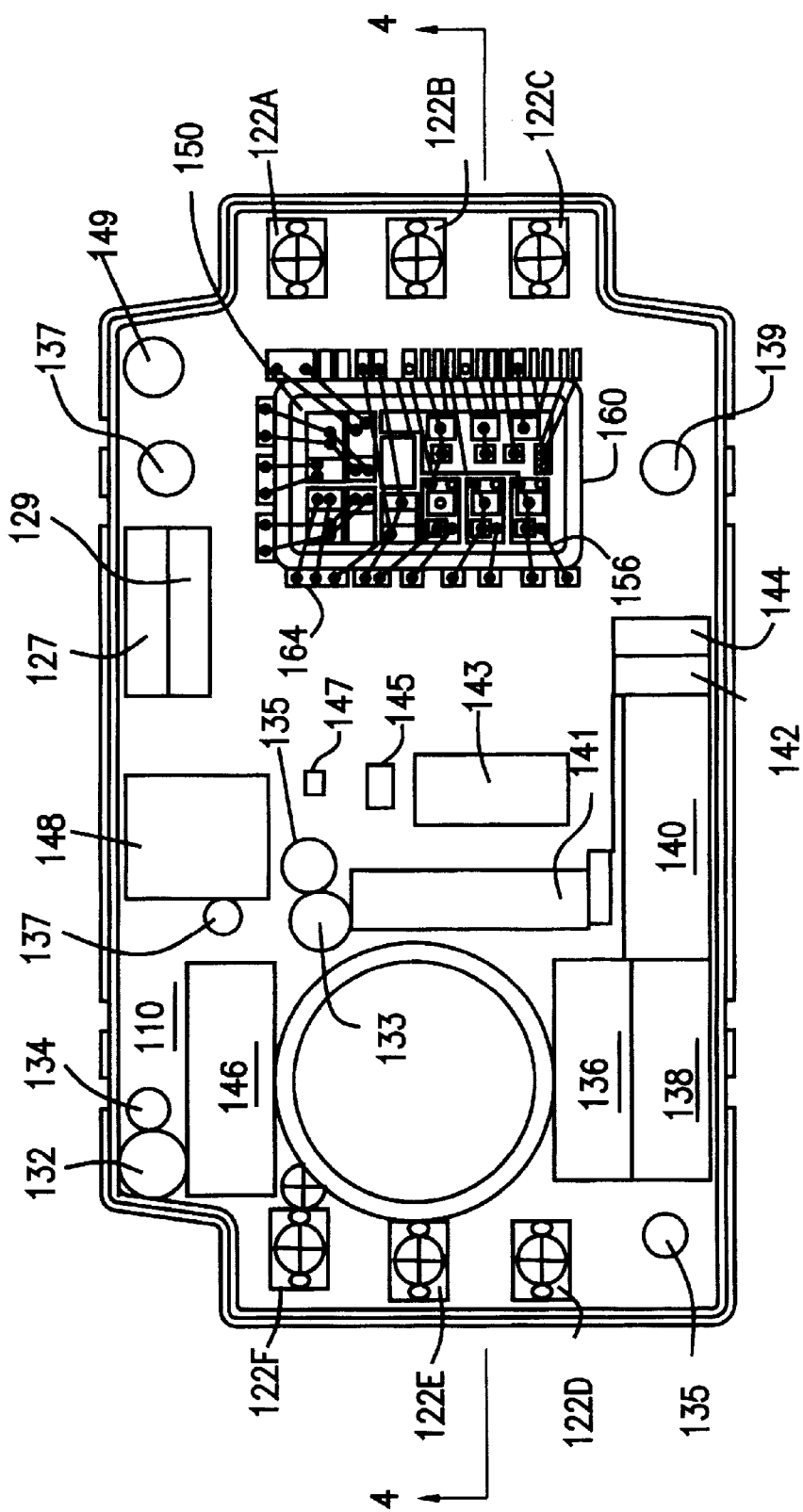
FIG. 2 shows a top view of the module of FIGS. 1A–1D with the IMS exposed.

FIG. 2 shows the top view shown in FIG. 1A of APM 100 but with the support tray and its capacitors removed. An opening 160 formed in circuit board 110 is situated above an IMS 150. The support tray 166 is situated above opening 160 and IMS 150. Bonding pads 164 are arranged around the periphery of opening 160 and are electrically connected to the other components mounted on the board. Bonding wires 156 provide electrical connections between the bonding pads 164 of the circuit board and the components mounted on IMS 150.

Figure 3:
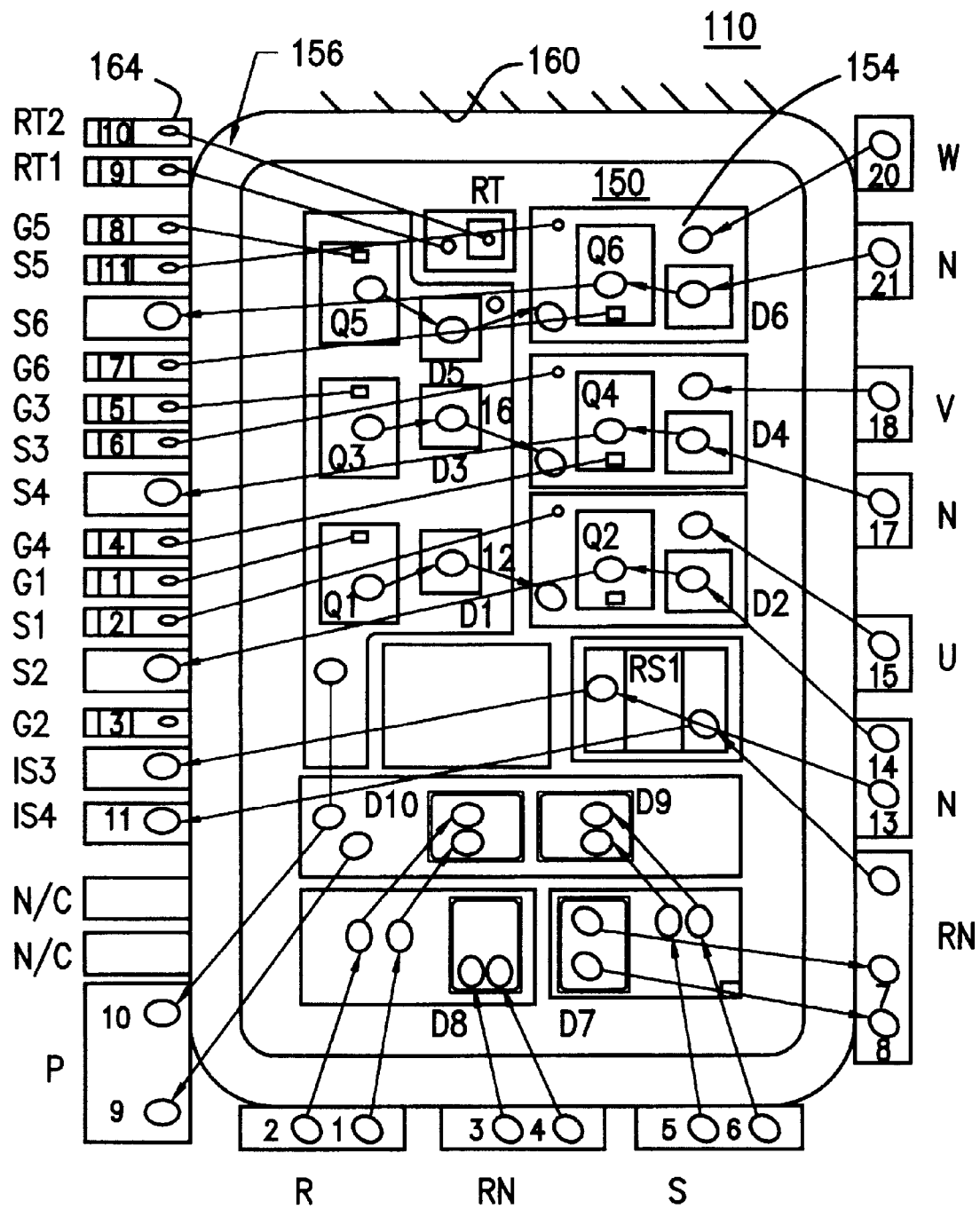
FIG. 3 shows the IMS substrate and its interconnect to the PCB of FIG. 2 in greater detail.

FIG. 3 shows the top view of the IMS as well as a portion of the circuit board 110 that surrounds opening 160 in greater detail. Mounted atop IMS 150 are various components including MOS-gate controlled power semiconductor devices Q1–Q6, diodes D1–D10 as well as resistors RT and RS1. Each of these components are thermally and electrically mounted atop portions of a conducting patterned material 154, such as copper. Also present, on the top surfaces of the devices, are bonding pad areas. Bonding wires 156 provide connections from the various components as well as from bonding pads 164 to the conducting pattern and the pad areas of the IMS components.

Figure 4A:
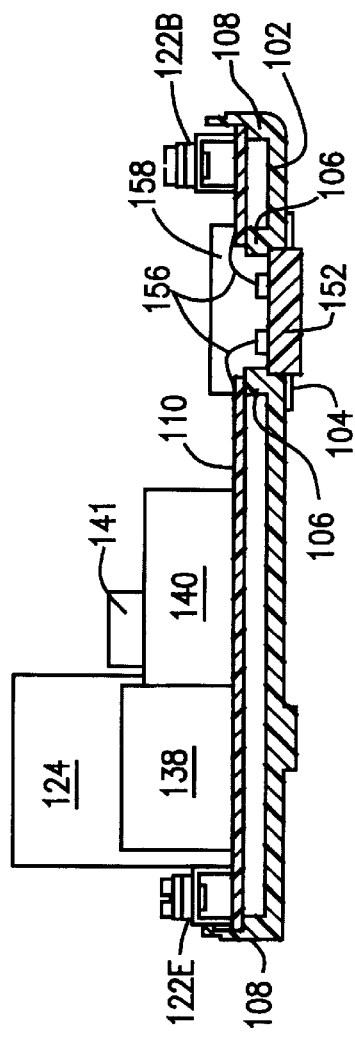
FIG. 4A shows a cross-sectional view of the PCB of FIG. 2 taken along lines 4—4.

FIG. 4A illustrates a cross-sectional view of the structure of FIG. 2. The IMS has a relatively thick body 152 formed of a conductive metal, such as aluminum, that is covered by a very thin insulation layer which, in turn, carries the conductive pattern which is electrically insulated from the body. Also present are heat spreaders (not shown) to which the components are mounted for improving thermal management of the heat generated by the components during their operation. An example of an IMS is described in the above-mentioned U.S. Pat. No. 5,408,128, which is incorporated herein by reference.

Significantly, the IMS is mounted in an opening of the support body 102 such that it is situated below the circuit board 110 and such that the bottom surface of the body 152 is located co-planar with or below the bottom surface 104 of support body 102 and is available for thermal contact with a heatsink (not shown). Also present, preferably, are raised portions 106 and 108 which extends from support body 102 and support the circuit board 110 at the opening and periphery, respectively, of the circuit board 110. The raised portions 106 and the opening in the circuit board form a cavity above the IMS which is filled with a high grade potting material 158 to cover the top surface of the IMS. A lower grade, and less costly, potting material can then be used between the bottom surface of the circuit board and the support body as well as to cover at least a portion of the components mounted atop the circuit board.

Figure 4B:
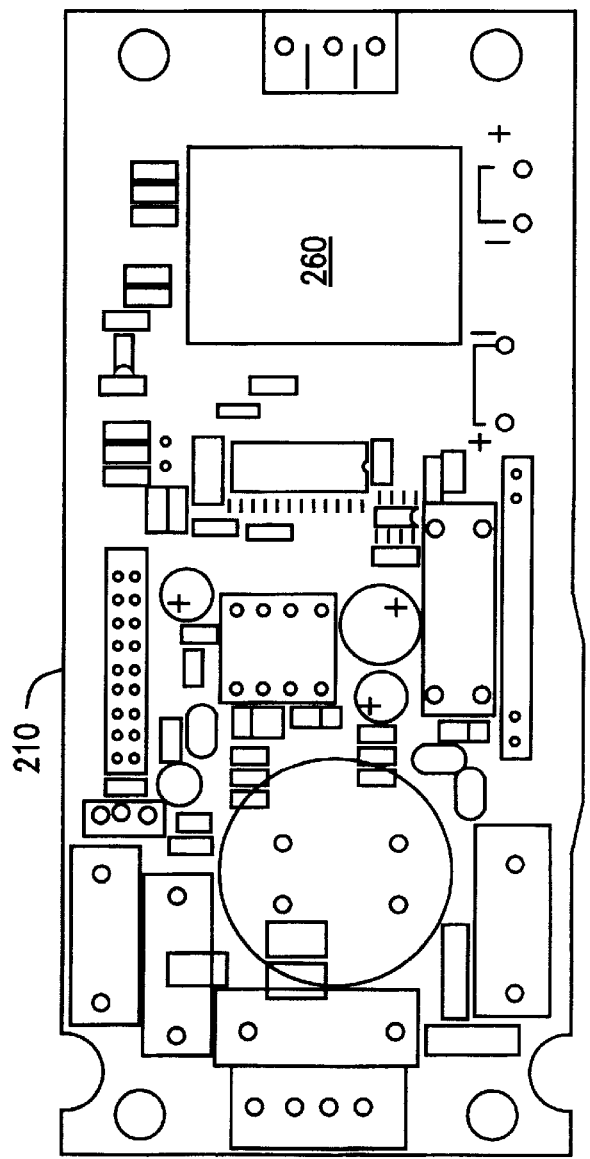
FIG. 4B shows a top view of the PCB.

FIG. 4B shows an example of a circuit board 210 which is suitable for mounting components as well as having an opening 260 that is to be situated above the IMS and employed in the manner of the invention.

Advantageously, and in accordance with the invention, the arrangement of the opening in the circuit board above the IMS minimizes the number and the length of the bonding wires that connect the components mounted atop the IMS and those mounted on the circuit board. Moreover, by mounting only the high power components on the IMS, the cost of the module is greatly reduced. Further, because both the high power and low power components are mounted in the same module, the footprint is greatly reduced, and the number of interconnections is further decreased. Additionally, by limiting the high grade potting compound to only the region atop the IMS, the cost of the module is also reduced.

It should also be noted that a cover, such as a molded cover, (not shown) may be supplied atop the circuit board to cover the components of the circuit board and the IMS and is preferably supported by the periphery of the support base.

Other packages have also been generated for motor controllers in the 0.1 to 1.0 HP range.

Figure 5A:
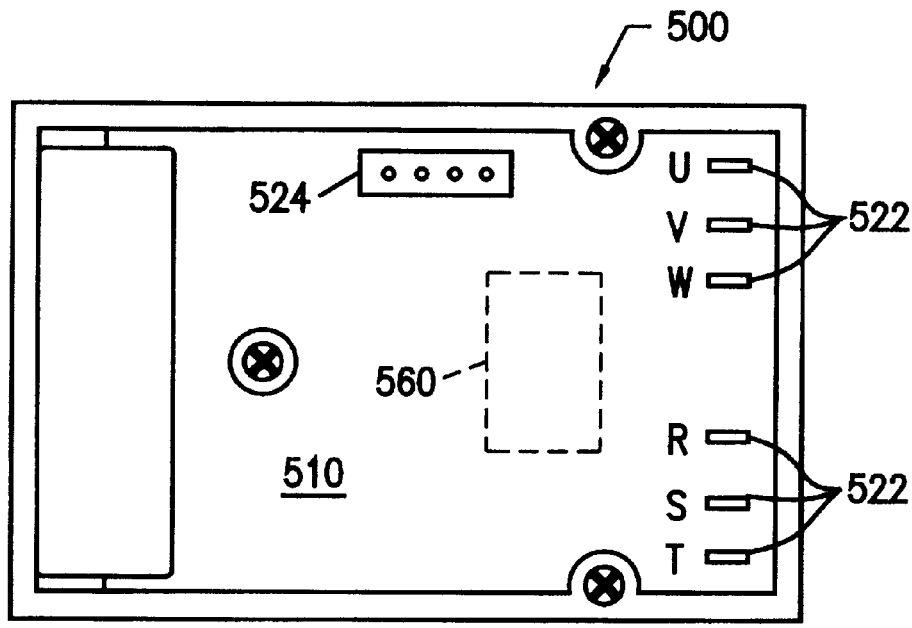
FIGS. 5A and 5B show a top view and a cross-sectional view, respectively, of an adaptable planar module according to a further embodiment of the invention.
Figure 5B:
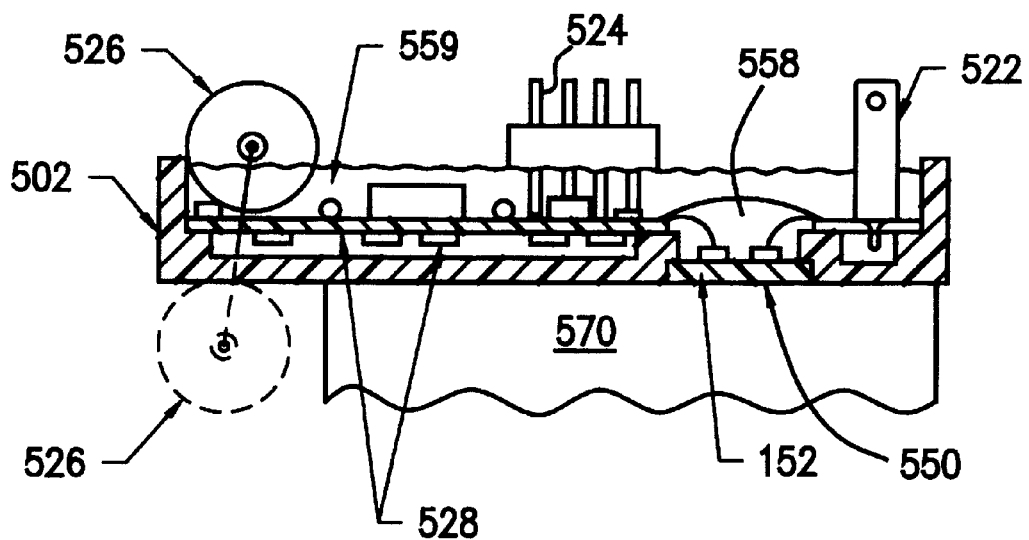

FIGS. 5A and 5B show an example of appliance APM package 500 with no input/output filters in accordance with another embodiment of the invention. A molded shell support base 502 supports a printed circuit board 510 and has an opening through which IMS 550 is mounted. The bottom surface of the IMS 550 contacts heatsink 570 to remove heat from the power devices mounted atop the IMS, as described above. Also, an opening 560 formed in the circuit board is situated atop the IMS to minimize the length of the wire bonds. As also described above, a high grade potting material 558 fills a cavity region above the IMS, and a lower grade potting material 559 is present elsewhere in the module. It should also be noted that components 528 are mounted both on the top and bottom surfaces of the module. Bus capacitor 526 is mounted atop circuit board 510. Optionally, bus capacitor 526 can be mounted below circuit board 510 on the exterior of base 502, away from heatsink 570.

Here, the terminals 522 are fast-on connectors with in-line connector pins for providing control signals. Also shown are optional input/output pins 524. The typically 3.0"×2.0"×0.5" package can house a full motor control circuit, including an inverter circuit, input circuits, protection circuits and a microprocessor. The inverter and input circuits are located on the IMS 550, and other components 528 are located on the circuit board 510. The 3.0 inch length is a protective maximum size, though streamlined products may be smaller in size.

Figure 6A:
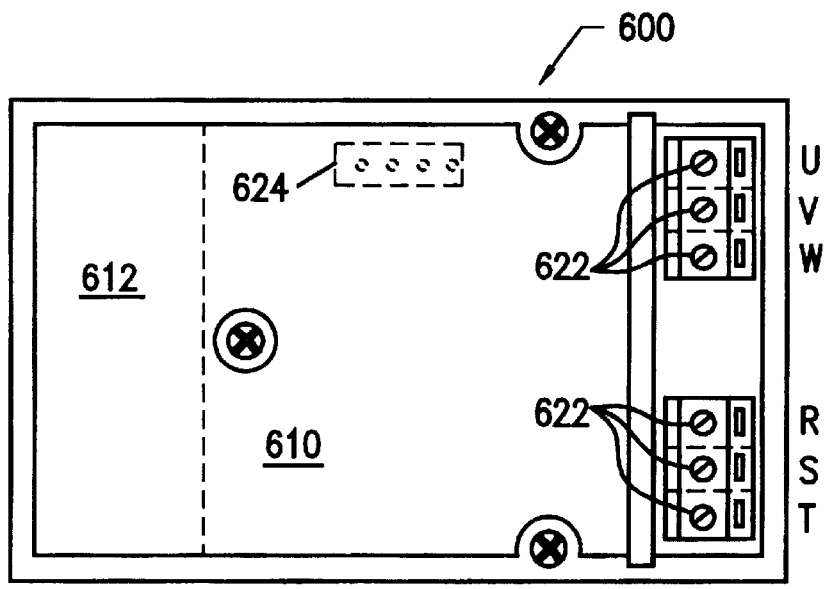
FIGS. 6A and 6B respectively show a top view and a cross-sectional view, of a micro-inverter module according to another aspect of the invention.
Figure 6B:
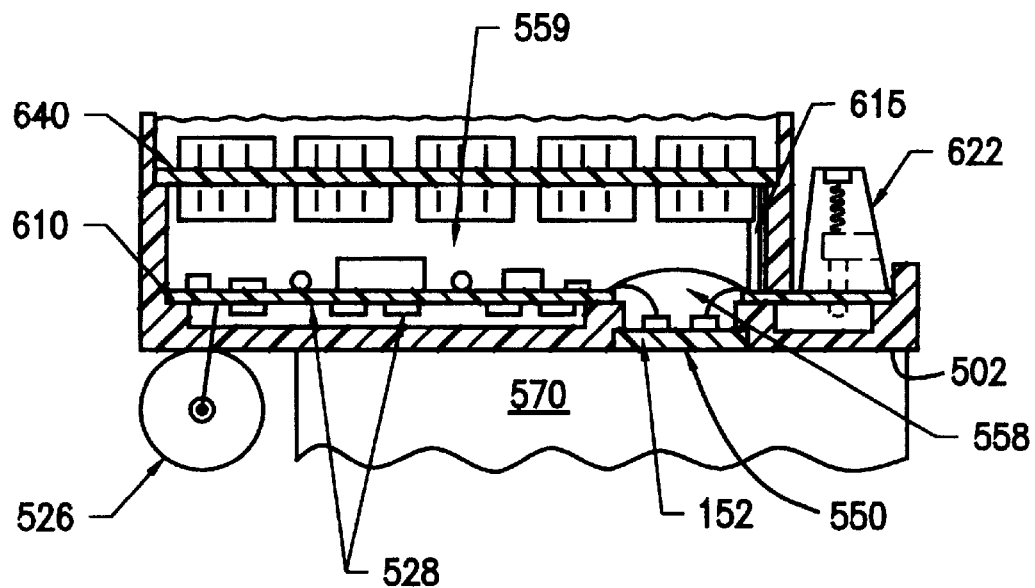
Figure 7A:
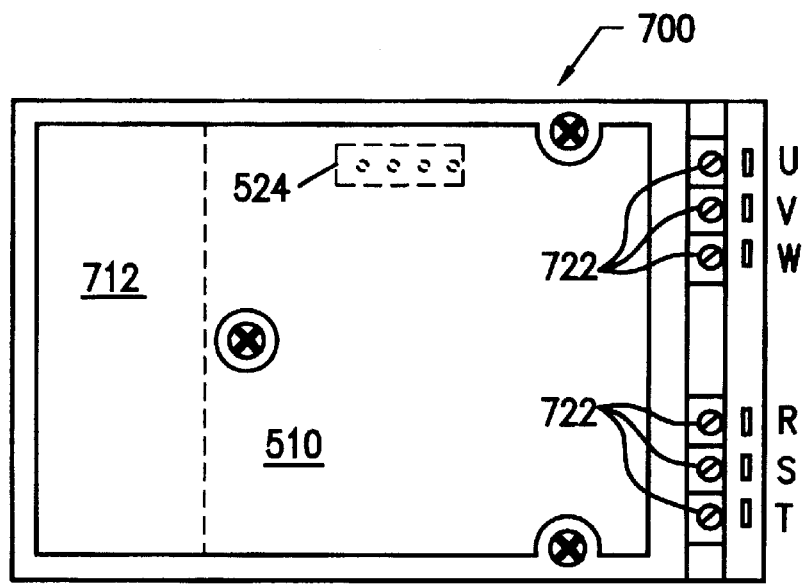
FIGS. 7A and 7B show a top view and a cross-sectional view, respectively, of a micro-inverter module according to still further embodiment of the invention.
Figure 7B:
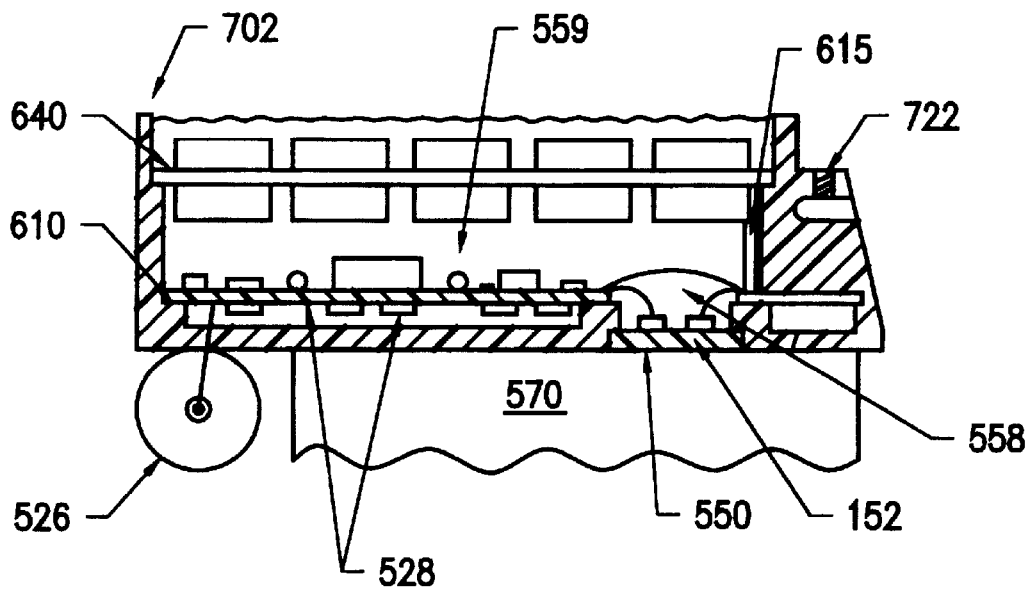

FIGS. 6A and 6B show an example of a micro-inverter APM package 600 with full input/output filters according to a further embodiment of the invention. This embodiment is similar to the appliance APM 500 except that an additional printed circuit board 640 is added for supporting the inductors and capacitors of the input/output filters. The added board 640 is connected to board 610 by interconnect lead frame 615. The size of the added board and its components will vary with power rating of the APM, which ranges typically between 0.1 to 1.0 HP. There are two terminal variations for the micro-inverter APM. Here, FIGS. 6A and 6B show a simple shell with procured terminals 622. Alternatively, FIGS. 7A and 7B show a substantially similar APM 700 with a shell 702 and integrated terminals 722. Note that with the procured terminals or the integrated terminals, the terminals are soldered to the main PCB with an isolated potting cavity. Optional input/output pins 624 are also shown.

Figure 8A:
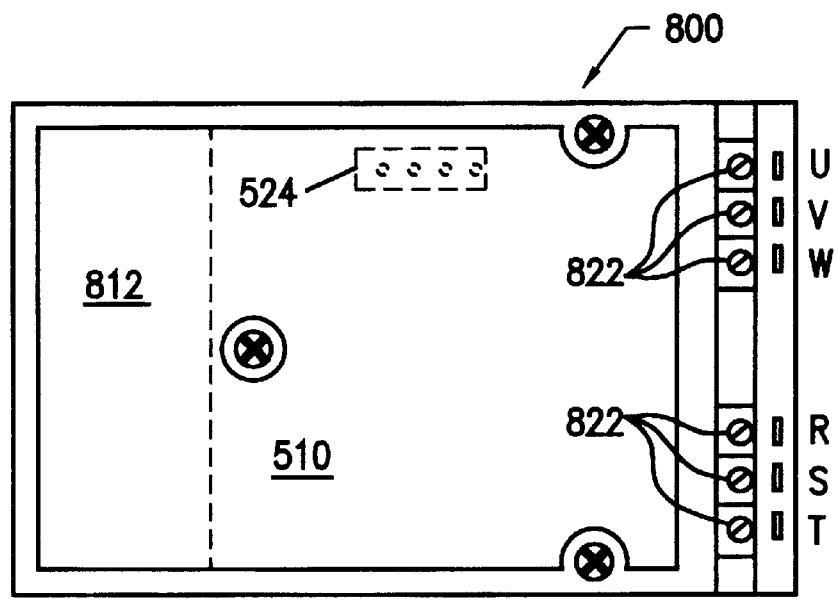
FIGS. 8A and 8B show a top view and cross-sectional view, respectively, of a micro-inverter module according to yet another embodiment of the invention.
Figure 8B:
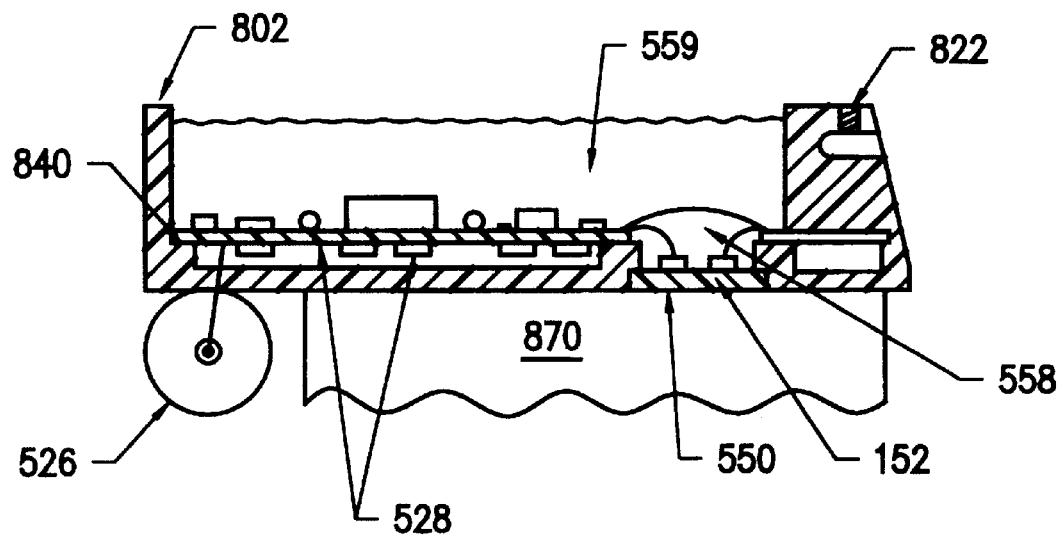

FIGS. 8A and 8B show an example of a micro-inverter APM package 800 with no filters in accordance with a still further embodiment of the invention. The package is similar to that of FIGS. 6A–6B and 7A–7B except the body height is reduced by the elimination of the added circuit board that otherwise holds the filter circuit. Instead, a bus capacitor 526 is mounted below the bottom surface of the base 802 but away from heatsink 870. Though FIGS. 8A and 8B show integrated shell terminals 822, the procured terminals are also an option.

The APM packages of FIGS. 6A–6B, 7A–7B and 8A–8B can also be modified to accommodate a keyboard 612, 712 or 812, respectively, on the top surface of the PCB. The packages can also accommodate a lid which may provide EMI shielding. The filtering and package of the invention are designed to minimize filter size and have an architecture such that common tooling and processing can be used where possible for more than one embodiment of the APM.

Figure 9A:
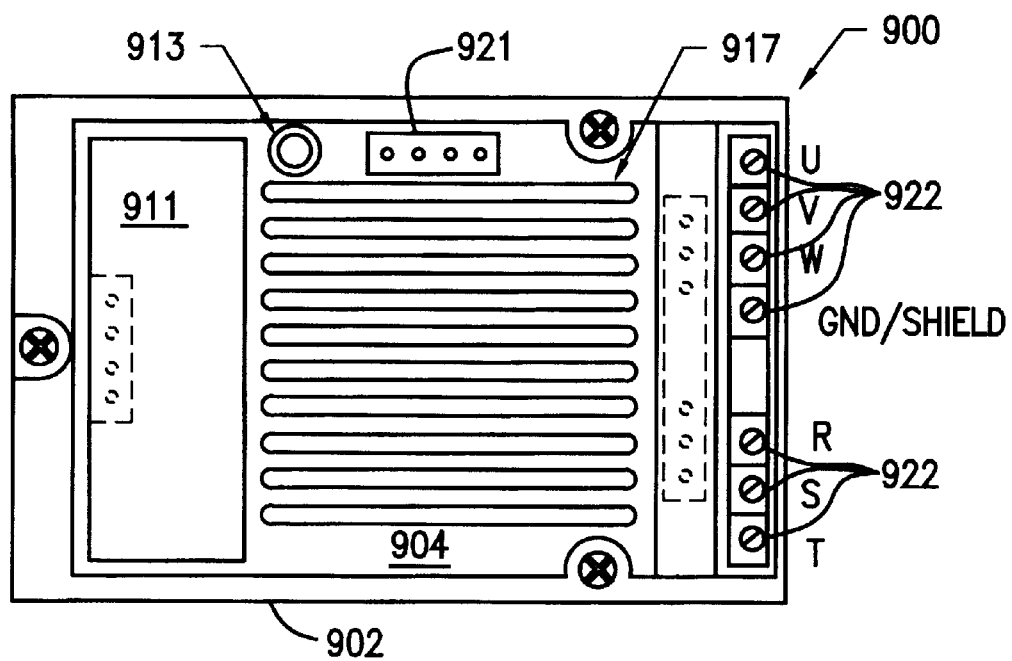
FIGS. 9A and 9B show respective top and cross-sectional views of an adaptable planar module according to another embodiment of the invention.
Figure 9B:
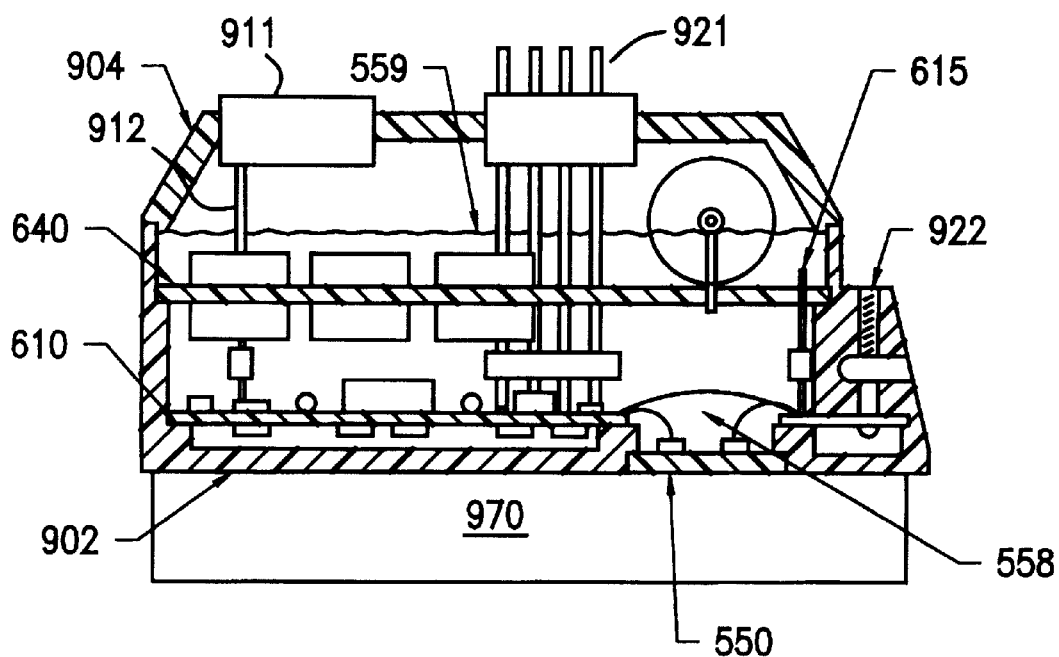

FIGS. 9A and 9B show top and cross-sectional views of an embodiment of a complete motor drive APM 900 with integrated terminals 922 in further accordance with the invention. Here, a molded cover lid 904 is shown covering base 902 which includes an input/output connector 921, LED 913 and air vents 917. APM 900 further includes optional keyboard 911 protruding through an opening in cover lid 904. Keyboard 911 is coupled to circuit board 640 via connector 912. The bottom surface of IMS 550 contacts heatsink 970.

Figure 10A:
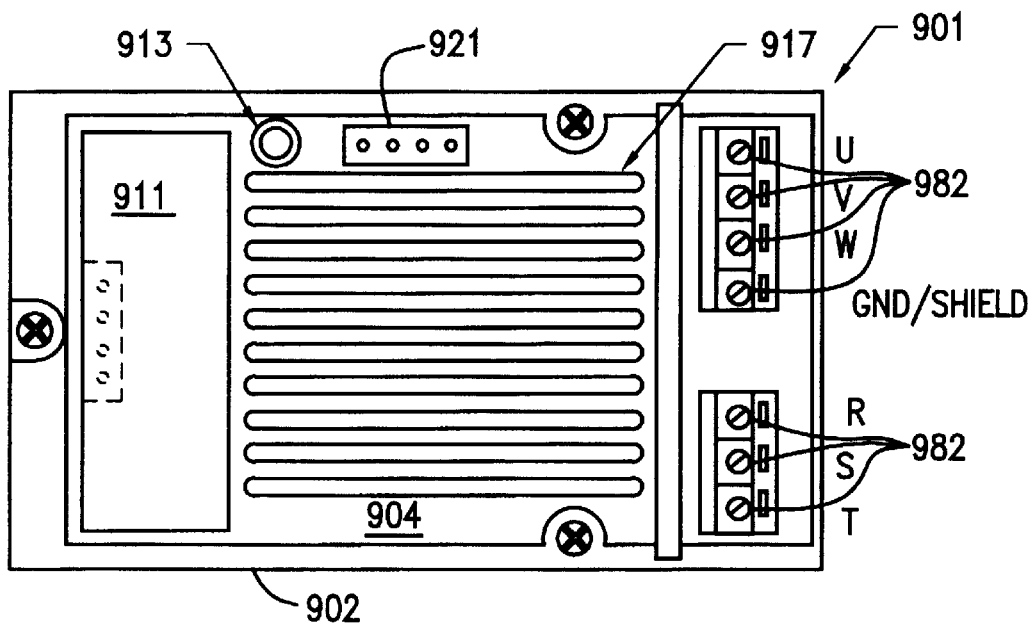
FIGS. 10A and 10B show a top view and a cross-sectional view, respectively, of an adaptable planar module according to still further embodiment of the invention.
Figure 10B:
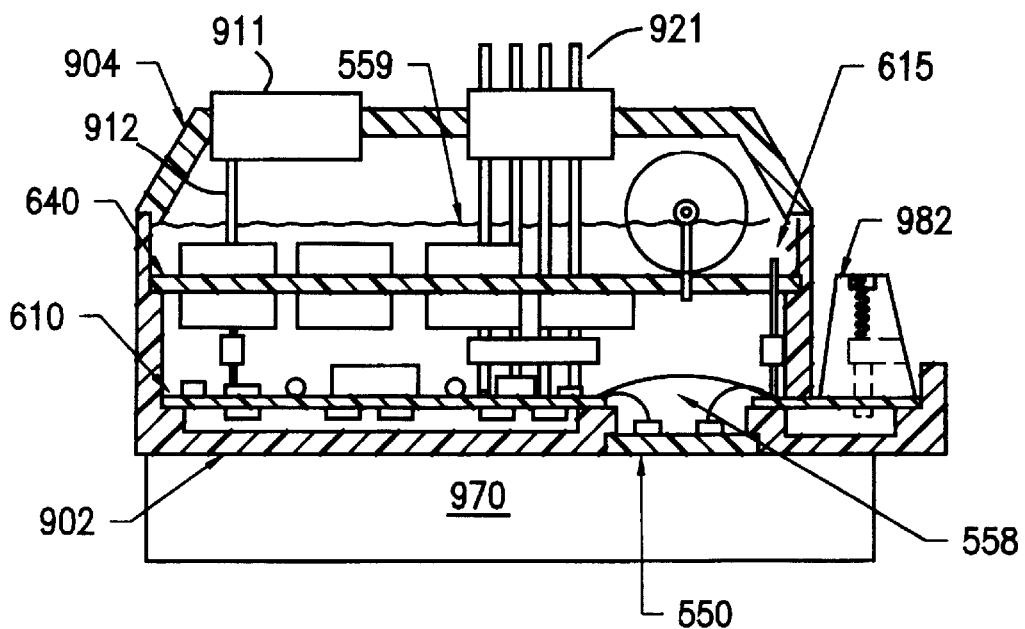

FIGS. 10A–10B show another example of a top and cross-sectional views of a complete motor drive APM 901 with attached terminals 982 according to another embodiment of the invention. The attached terminals 982 are substituted in place of integrated terminals 922 shown in FIGS. 9A–9B.

Figure 11:
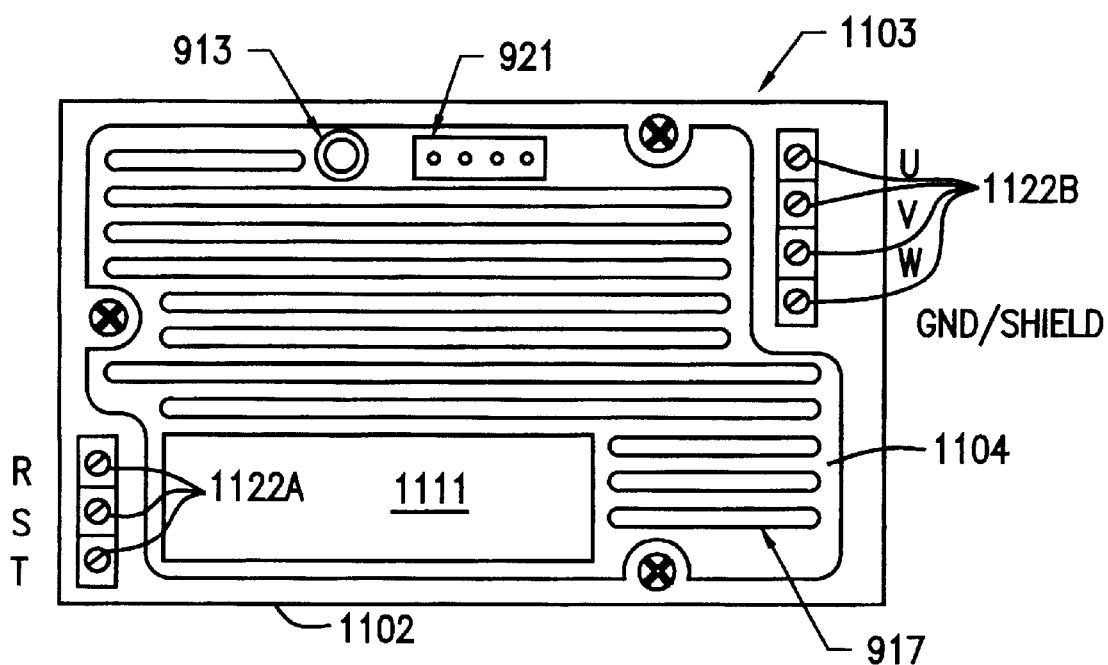
FIG. 11 shows a top view of an adaptable planar module according to an additional embodiment of the invention.

FIG. 11 shows a top view of another embodiment of a complete motor drive APM 1103 in accordance with the invention. In this example, integrated terminals 1122A and 1122B are located at opposite ends of the package and keyboard 1111 is positioned longitudinally with respect to the longer side of base 1102. Molded cover lid 1104 is adapted to accommodate optional keyboard 1111 and terminals 1122A and 1122B.

Figure 12:
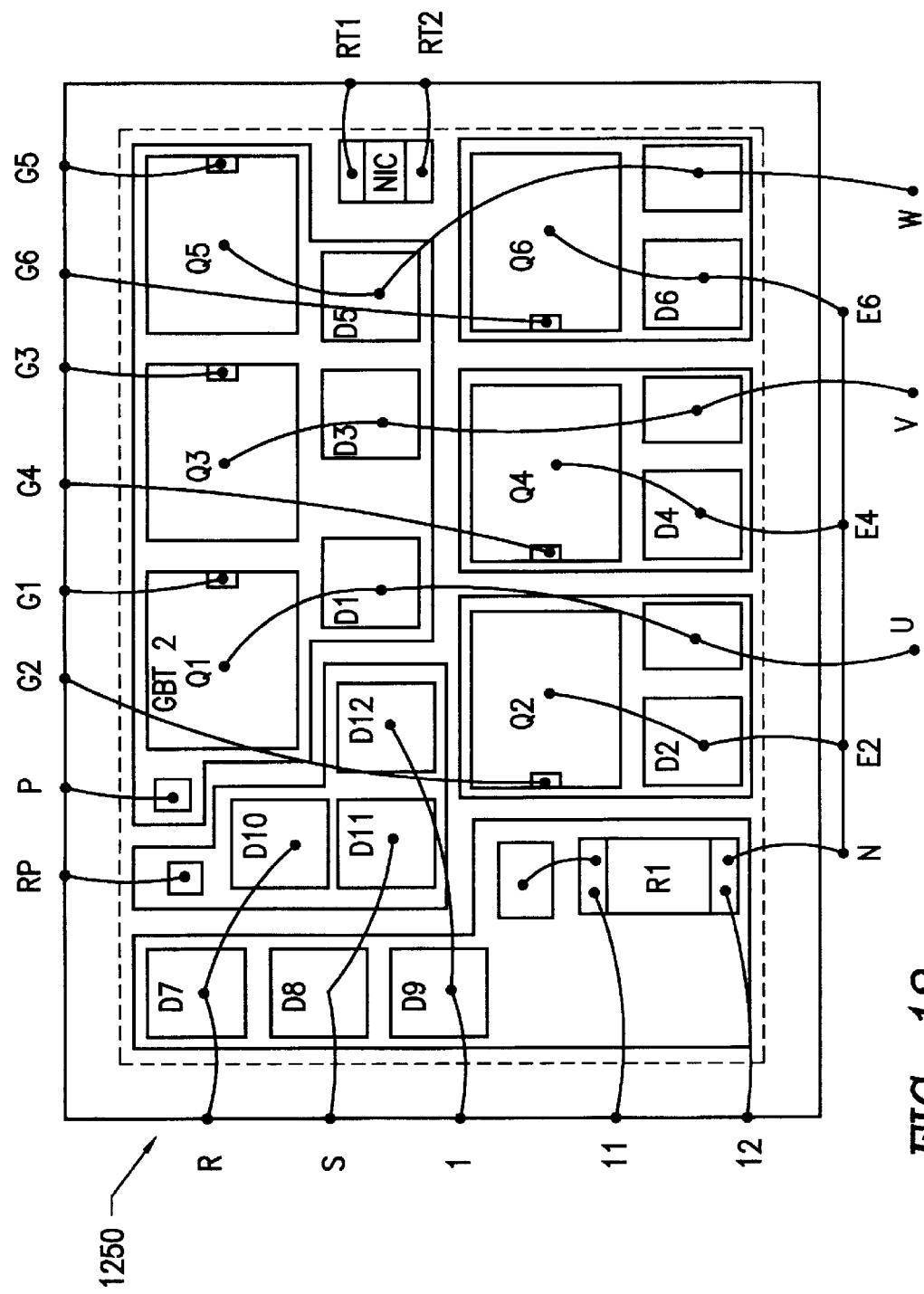
FIG. 12 shows a top view of a further arrangement of an IMS according to the invention.

FIG. 12 shows a further example of an IMS 1250 comprised of plural transistors, IGBTs, diodes and resistors which are interconnected as well as externally connected.

Figure 13A:
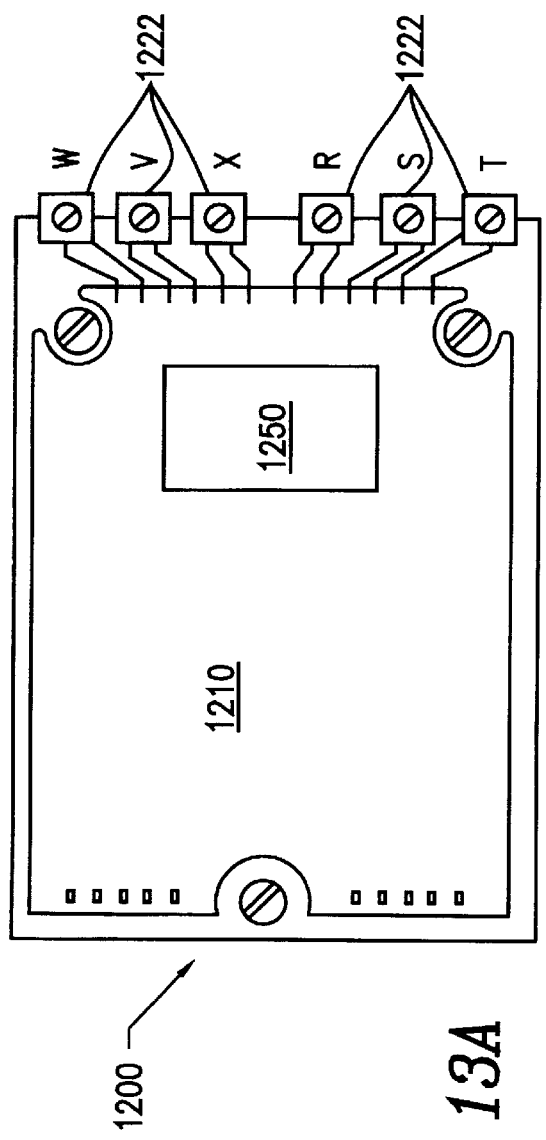
FIGS. 13A and 13B show respective top and side views of an example of a ½ HP motor control module which is capable of housing the IMS of FIG. 13.
Figure 13B:
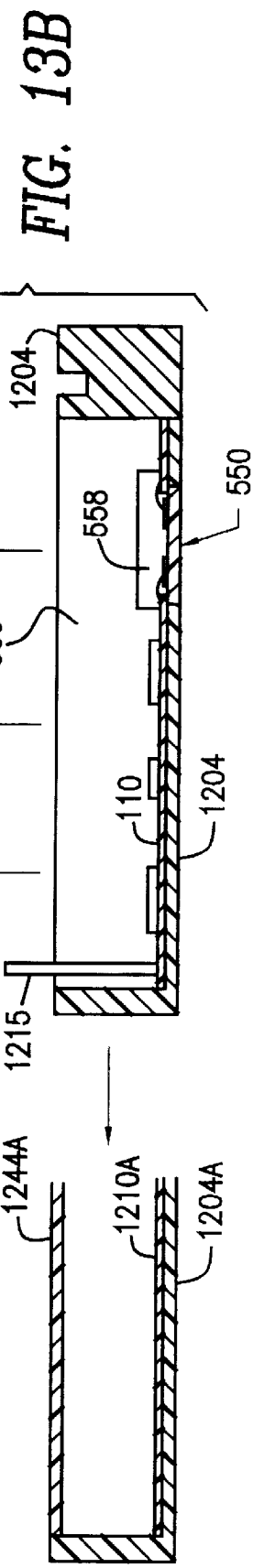

FIGS. 13A and 13B illustrate an embodiment of a ½ HP motor control module and drive circuit APM module 1200 which is likewise in accordance with the invention. As shown, the module includes a base 1204, a driver PCB 1210 and houses an IMS 1250, such as is shown in FIG. 13, which is connected to the driver PCB by connector 1215. A control board 1240 may be included in the module and arranged atop the driver circuit board, and a further optional keyboard 1244 may be included and arranged atop the control board. Integrated terminals 1222 are positioned along one edge of module 1200.

Alternatively, the module is extended in length so that control circuits may be included on an extended driver PCB 1210A positioned within an extended base 1204A. Here, an extended keyboard 1244A may also be included in the module and arranged atop the extended circuit board.

Advantageously, the novel features of the above embodiment of the APM of the invention allow these products to be manufactured at lower cost. The primary cost reduction features include: 1) minimized IMS substrate area, 2) a thinner IMS substrate, 3) no wire bonds on the IMS metalization, 3) all tracks on a double side PCB, 4) all substrate-to-IMS connections are wire bonds that are ordinarily otherwise present, 5) an integrated driver and microprocessor printed circuit board, 6) an integrated shell/ terminal molding option, 7) a single package for all functions with potting to reduce size and UL creepage path limitations, and 8) compatible tooling for European and U.S. products for both micro-inverter and appliance products.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device module comprising:
    a support base having top and bottom surfaces and having an opening therein which extends from said top surface to said bottom surface, a length and a width of said support base defining a first area;
    a planar, thermally conductive substrate disposed in said opening in said support base such that a bottom surface of said substrate is disposed to contact an external heatsink located beneath said bottom surface of said support base, a length and a width of said planar, thermally conductive substrate defining a second area such that said first area is at least approximately six times larger than said second area;
    at least one semiconductor device mounted on a top surface of said thermally conductive substrate;
    at least one circuit board arranged above and spaced from said top surface of said base and having an opening therein that is situated above said thermally conductive substrate;
    at least another device mounted on a top surface of said circuit board;
    said top surface of said circuit board having at least one bonding pad area arranged at a periphery of said opening in said circuit board and being electrically connected to said another device; and
    at least one bonding wire for connecting said one semiconductor device to said bonding pad.

2. The module of claim 1, wherein a plurality of semiconductor devices are mounted on said thermally conductive substrate, at least one of said plural semiconductor devices being connected to another of said plural semiconductor devices.

3. The module of claim 1, wherein said thermally conductive substrate comprises an insulated metal substrate (IMS).

4. The device of claim 1, wherein said support base includes raised portions which extend above said top surface of said support base and surround said opening in said circuit board, thereby forming a cavity atop said thermally conductive substrate.

5. The module of claim 4, wherein said cavity is filled with a high grade potting material.

6. The module of claim 1, wherein at least a portion of a region atop said circuit board is filled with a low grade potting material.

7. The module of claim 4, wherein said support base includes further raised portions which support said circuit board.

8. The module of claim 1, further comprising at least one integral terminal which is mounted atop said circuit board for providing an external electrical connection and which is electrically connected with said another device.

9. The module of claim 1, further comprising at least one procured terminal formed in a raised portion of said support base for providing an external electrical connection and which is electrically connected to said another device.

10. The module of claim 1, further comprising a keyboard mounted atop said circuit board.

11. The module of claim 1, wherein at least a further device is mounted on a bottom surface of said circuit board.

12. The module of claim 1, further comprising another circuit board which is mounted above and spaced from said one circuit board and having at least a further device mounted on a surface of said another circuit board.

13. The module of claim 12, further comprising a keyboard which is mounted on said surface of said another circuit board.

14. The module of claim 12, further comprising at least an additional device mounted on another surface of said another circuit board.

15. The module of claim 1, wherein said at least one semiconductor device comprises a power semiconductor device.

16. The module of claim 2, wherein said plurality of semiconductor devices includes an inverter circuit.

17. The module of claim 1, further comprising a molded cover situated above said circuit board and said thermally conductive substrate.

18. A motor drive module comprising:
a support base having top and bottom surfaces and having an opening therein which extends from said top surface to said bottom surface, a length and a width of said support base defining a first area;
a planar, thermally conductive substrate disposed in said opening in said support base such that a bottom surface of said substrate is disposed to contact an external heatsink located beneath said bottom surface of said support base, a length and a width of said planar, thermally conductive substrate defining a second area such that said first area is at least approximately six times larger than said second area;
at least one semiconductor device mounted on a top surface of said thermally conductive substrate;
at least one circuit board arranged above and spaced from said top surface of said base and having an opening therein that is situated above said thermally conductive substrate;
at least another device mounted on a top surface of said circuit board;
said top surface of said circuit board having at least one bonding pad area arranged at a periphery of said opening in said circuit board and being electrically connected to said another device; and
at least one bonding wire for connecting said one semiconductor device to said bonding pad.

19. The module of claim 18, wherein a plurality of semiconductor devices are mounted on said thermally conductive substrate, at least one of said plural semiconductor devices being connected to another of said plural semiconductor devices.

20. The module of claim 18, wherein said thermally conductive substrate comprises an insulated metal substrate (IMS).

21. A micro-converter module comprising:
a support base having top and bottom surfaces and having an opening therein which extends from said top surface to said bottom surface, a length and a width of said support base defining a first area;
a planar, thermally conductive substrate disposed in said opening in said support base such that a bottom surface of said substrate is disposed to contact an external heatsink located beneath said bottom surface of said support base, a length and a width of said planar, thermally conductive substrate defining a second area such that said first area is at least approximately six times larger than said second area;
at least one semiconductor device mounted on a top surface of said thermally conductive substrate;
at least one circuit board arranged above and spaced from said top surface of said base and having an opening therein that is situated above said thermally conductive substrate;
at least another device mounted on a top surface of said circuit board;
said top surface of said circuit board having at least one bonding pad area arranged at a periphery of said opening in said circuit board and being electrically connected to said another device; and
at least one bonding wire for connecting said one semiconductor device to said bonding pad.

22. The module of claim 21, wherein a plurality of semiconductor devices are mounted on said thermally conductive substrate, at least one of said plural semiconductor devices being connected to another of said plural semiconductor devices.

23. The module of claim 21, wherein said thermally conductive substrate comprises an insulated metal substrate (IMS).

24. The module of claim 1 further comprising a support tray disposed on said circuit board and arranged above said thermally conductive substrate.

25. The module of claim 24 wherein said support tray, said circuit board and said support base each have overlaying openings for securing said module.

26. A semiconductor device module comprising:
a planar, thermally conductive substrate having a bottom surface that is disposed to contact a heatsink located beneath said bottom surface;
at least one semiconductor device mounted on a top surface of said thermally conductive substrate;
at least one circuit board arranged above and spaced from a surface of the heatsink and having an opening therein that is situated above said thermally conductive substrate, said opening being approximately a same size as said thermally conductive substrate;

at least another device mounted on a top surface of said circuit board;

said top surface of said circuit board having at least one bonding pad area arranged at a periphery of said opening in said circuit board and being electrically connected to said another device;

at least one bonding wire for connecting said one semiconductor device to said bonding pad; and a support structure for providing spacing between said circuit board and the heatsink.

27. The module of claim 26, wherein a plurality of semiconductor devices are mounted on said thermally conductive substrate, at least one of said plural semiconductor devices being connected to another of said plural semiconductor devices.

28. The module of claim 26, wherein said thermally conductive substrate comprises an insulated metal substrate (IMS).

29. The module of claim 26, wherein a region atop said thermally conductive substrate is filled with a high grade potting material and a region atop said at least one circuit board is filled with a low grade potting material.

30. The module of claim 26, wherein at least a further device is mounted on a bottom surface of said circuit board.

31. The module of claim 26, wherein said at least one semiconductor device comprises a power semiconductor device.

32. The module of claim 26, further comprising a molded cover disposed on said circuit board and arranged above said thermally conductive substrate.

33. A semiconductor device module comprising:

a planar, insulated metal substrate having a bottom surface that is disposed to contact a heatsink located beneath said bottom surface;

at least one semiconductor device mounted on a top surface of said insulated metal substrate;

at least one circuit board arranged above and spaced from a surface of the heatsink and having an opening therein that is situated above said insulated metal substrate;

at least another device mounted on a top surface of said circuit board;

said top surface of said circuit board having at least one bonding pad area arranged at a periphery of said opening in said circuit board and being electrically connected to said another device;

at least one bonding wire for connecting said one semiconductor device to said bonding pad; and a support structure for providing spacing between said circuit board and the heatsink, the support structure being comprised of an insulating material.

34. The module of claim 33, wherein a plurality of semiconductor devices are mounted on said insulated metal substrate, at least one of said plural semiconductor devices being connected to another of said plural semiconductor devices.

35. The module of claim 33, wherein a region atop said insulated metal substrate is filled with a high grade potting material and a region atop said at least one circuit board is filled with a low grade potting material.

36. The module of claim 33, wherein at least a further device is mounted on a bottom surface of said circuit board.

37. The module of claim 33, wherein said at least one semiconductor device comprises a power semiconductor device.

38. The module of claim 33, further comprising a molded cover disposed on said circuit board and arranged above said insulated metal substrate.

* * * * *